United States Patent [19]
Skrtic

[11] Patent Number: 5,396,988
[45] Date of Patent: * Mar. 14, 1995

[54] ELECTRONIC COMPONENT CARRIER TAPE WITH GENERIC POCKETS

[75] Inventor: Thomas Skrtic, Eau Claire, Wis.

[73] Assignee: Minnesota Mining and Manufacturing Company, St. Paul, Minn.

[*] Notice: The portion of the term of this patent subsequent to Oct. 4, 2011 has been disclaimed.

[21] Appl. No.: 42,137

[22] Filed: Apr. 2, 1993

Related U.S. Application Data

[63] Continuation-in-part of Ser. No. 876,045, Apr. 30, 1992, Pat. No. 5,351,821.

[51] Int. Cl.$^6$ ............................................. B65D 85/38
[52] U.S. Cl. ..................................... 206/330; 206/332
[58] Field of Search ................................. 206/328–334, 206/820; 53/453, 473; 29/832

[56] References Cited

U.S. PATENT DOCUMENTS

| | | | |
|---|---|---|---|
| 4,562,924 | 1/1986 | Okamoto | 206/332 |
| 4,564,880 | 1/1986 | Christ et al. | 361/212 |
| 4,657,137 | 4/1987 | Johnson | 206/330 |
| 4,702,370 | 10/1987 | Honda | 206/331 |
| 4,702,788 | 10/1987 | Okui | 206/330 |
| 4,966,281 | 10/1990 | Kawanishi et al. | 206/330 |
| 4,966,282 | 10/1990 | Kawanishi et al. | 206/330 |
| 5,076,427 | 12/1991 | Thomson et al. | 206/330 |
| 5,131,535 | 7/1992 | O'Connor et al. | 206/332 |
| 5,199,564 | 4/1993 | Skrtic | 206/330 |

FOREIGN PATENT DOCUMENTS

| | | | |
|---|---|---|---|
| 0350003 | 1/1990 | European Pat. Off. | H05K 13/00 |
| 0294463 | 11/1989 | Japan | 206/328 |
| 2-127256 | 5/1990 | Japan | B65D 73/02 |
| 0258573 | 10/1990 | Japan | 206/330 |
| 0124574 | 5/1991 | Japan | 206/330 |
| 3-133762 | 6/1991 | Japan | B65D 73/02 |

*Primary Examiner*—Jimmy G. Foster
*Attorney, Agent, or Firm*—Gary L. Griswold; Walter N. Kirn; Steven E. Skolnick

[57] ABSTRACT

A carrier tape is provided for storing electronic components and for supplying those components seriatim to a machine. The tape comprises an aligned row of pockets formed in the tape, with each pocket having a plurality of ribs that define lead-retaining slots therebetween for retaining the projecting leads of the electronic components positioned therein. At least one of the electronic components positioned within the carrier tape has a different number of leads than the pockets have lead-retaining slots, to facilitate the storage and delivery of different sized components within the pockets of a single carrier tape.

24 Claims, 6 Drawing Sheets

ELECTRONIC COMPONENT CARRIER TAPE WITH GENERIC POCKETS

CROSS REFERENCE TO RELATED APPLICATION

This application is a continuation-in-part of U.S. patent application Ser. No. 07/876,045, filed Apr. 30, 1992, U.S. Pat. No. 5,351,821.

TECHNICAL FIELD

This invention relates to a carrier tape for storing electronic components and for supplying those components seriatim to a machine.

BACKGROUND OF THE INVENTION

In the field of electronic circuit assembly, electronic components are often carried from a supply of such components to a specific location on a circuit board for attachment thereto. The components may be of several different types, one group of which is known as surface mount components. Surface mount components include, but are not limited to such things as memory chips, resistors, connectors, dual in-line processors (DIPS), capacitors, and gate arrays.

Surface mount components include a body having a plurality of leads that are formed in aligned rows. The rows typically project from at least two, and perhaps all four sides of a parallelepiped component body. The component body includes a major plane extending therethrough, which is generally parallel to the top surface and to the bottom surface of the body. One type of conventional surface mount component (such as that shown with reference to the present invention in FIG. 2) includes a row of leads that project from each of two opposed sides of the component body. The leads each extend outwardly for a first distance, downwardly for a second distance, and outwardly for a third distance. The lead portions extending for the third distance include the terminal ends of the leads, which are parallel to the major plane of the component body. A second type of conventional surface mount component (such as that shown in FIG. 4 with reference to the present invention) includes leads that project directly away from the body of the component. Again, the terminal ends of the leads each extend parallel to the major plane of the body of the component.

Rather than manually affixing each individual surface mount component to a circuit board, the electronics industry makes extensive use of robotic placement machines, which grasp a component at a specific location (the supply) and place it at another specific location (the circuit board). To ensure the sustained operation of such robotic placement machines, a continuous supply of electronic components must be furnished to the machine at a predetermined location in order that the robotic placement machine may be programmed to repeat a precise sequence of movements during every cycle. It is therefore important that each such component be located in the same position (i.e. the point at which the robotic placement machine grasps the component) as each preceding and succeeding component.

One way to provide a continuous supply of electronic components to a desired location is to provide a series of such components within spaced pockets of a carrier tape. The loaded carrier tape, which is usually provided in roll form, may then be advanced toward the pick-up location at a predetermined rate as each succeeding component is removed from the tape by the robotic placement machine. Conventional carrier tapes generally comprise a self-supporting lower portion that carries the component, and a flexible cover strip that aids in preventing foreign matter from deleteriously affecting the component. The cover strip is typically releasably bonded to the lower portion, (e.g. thermally, ultrasonically or adhesively), and is progressively peeled away from the lower portion just before the robotic placement machine removes the component from the carrier tape.

A conventional carrier tape 10 is shown in combination with a robotic placement machine 12 in FIG. 1. A supply roll 14 provides carrier tape 10 having an aligned plurality of regularly spaced pockets 16, each of which is loaded with a component. A stripper assembly 18 peels the cover strip 20 from carrier tape 10 around a stripper block 22, which assists in preventing stripper assembly 18 from pulling carrier tape 10 away from its designated path. Carrier tape 10 is advanced by a sprocket 24, which engages advancement holes along at least one outer edge of carrier tape 10 to advance carrier tape toward robotic placement machine 12. As each successive component reaches the desired pick-up point, the robotic placement machine grasps the component (either manually or by suction) and places it on a circuit board in the appropriate location.

One type of carrier tape that relates to the present invention is shown in U.S. Pat. No. 4,702,370 (Honda). The '370 patent discloses a carrier tape having a series of pockets for storage and delivery of electronic components. The walls of the pockets are formed to hold a component within, and include wall portions that act to retain each of the leads. The '370 patent further states that "[t]o store and hold such an IC or similar-shaped component . . . the shape of the recess 34 is determined in accordance with the greatest peripheral dimensions of this IC or similar-shaped component 40." Thus the carrier tapes of the prior art, as exemplified by the '370 patent, include pockets that are designed to match the size of the series of components to be packaged.

Carrier tapes generally, and the carrier tape of the '370 patent in particular are not intended to convey surface mount components of different sizes. As described above, known carrier tapes include pockets sized to match a particular series of components. To package components of different sizes, a packager would have to stock carrier tapes of different sizes, corresponding to each of the sizes of surface mount components that were to be packaged. Because there are dozens, or perhaps even hundreds of sizes of surface mount components, a component packager could be required to maintain a sizable inventory of carrier tapes, and incur the concomitant costs thereof.

In view of the disadvantages of conventional carrier tapes, it is therefore desirable to provide a carrier tape for surface mount components that can convey different types and sizes of surface mount components.

SUMMARY OF THE INVENTION

A flexible carrier tape is provided for storage and delivery of electronic components by an advancement mechanism, each component having a body including a number of leads arranged in at least one aligned row and projecting from the body. The carrier tape includes a strip portion having a top surface, the strip portion including means for engaging the advancement mechanism; a plurality of aligned pockets spaced along the carrier tape and opening through the top surface, the pockets each including four side walls each at generally right angles with respect to each adjacent side wall, the side walls adjoining and extending downwardly from the top surface of the strip portion, a bottom wall adjoining the side walls to form the pocket, and a plurality of individual ribs that define a number of lead-retaining slots therebetween, the number of lead-retaining slots not equal to the number of leads of at least one of the electronic components. Thus, the carrier tape is adapted to carry at least one electronic component within each of the pockets.

In other aspects, the present invention also includes a carrier tape substantially as described above, and further including an electronic component within each pocket. Also provided is a method of loading electronic components into the pockets of such a carrier tape.

BRIEF DESCRIPTION OF THE DRAWINGS

The invention will be more readily understood with reference to the accompanying drawings, wherein like reference numerals refer to like components throughout the several views, and wherein.

DETAILED DESCRIPTION

The present invention relates broadly to a carrier tape having a plurality of pockets formed therein, each of which includes a plurality of ribs which define lead-retaining slots. Each pocket is adapted to contain different sizes of electronic components, each having similarly spaced leads, or electronic components having a varying number of similarly spaced leads. For example, the present invention is believed-to have utility with regard to surface mount components, which are electronic components having a body including a major plane and a plurality of aligned leads projecting therefrom. The terminal ends of the leads extend generally parallel to the major plane of the body, as shown with respect to two exemplary surface mount components in FIGS. 2 and 4. However, other types of electronic components are also contemplated.

Figure 1:
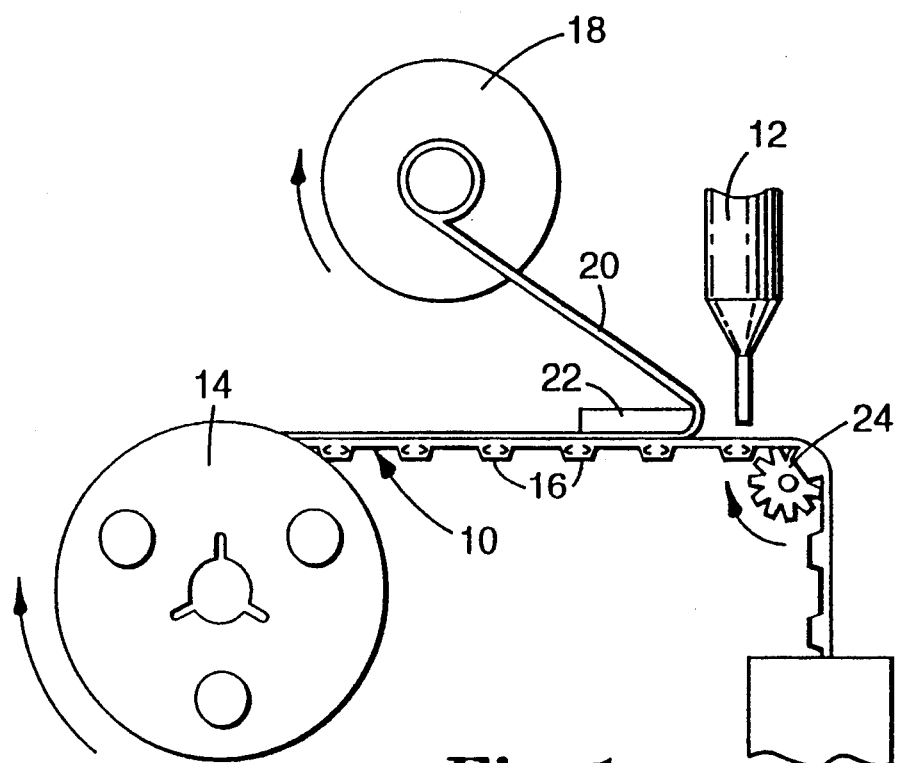
FIG. 1 is a schematic representation of a carrier tape being supplied to a robotic placement machine.

Referring to FIGS. 2 through 4 and 6 through 9, a unitary flexible carrier tape 100 is shown, which is generally self-supporting, having a strip portion 102 defining a top surface. Strip portion 102 includes at least one, and preferably two rows of aligned advancement holes 104 and 106 formed therein, which holes are adapted for engagement with an advancement mechanism, as shown in FIG. 1. The advancement mechanism typically comprises one sprocket for each row of advancement holes, and the teeth of each sprocket engage the holes to advance the carrier tape toward a predetermined point, at which point the robotic placement machine may grasp the individual electronic components seriatim. The holes and the spacing between adjacent holes may also be varied to accommodate different types of advancement mechanisms. In one embodiment, the holes measure on the order of 1.55 mm. (0.061") in diameter and are regularly spaced at a distance of approximately 4 mm. (0.16") on center.

Pockets 108 are formed in and spaced along strip portion 102 in one or more aligned rows, as shown in FIGS. 2, 4, 6 and 8. In the illustrated embodiments, each pocket includes four side walls 110 each at generally right angles with respect to each adjacent wall. Side walls 110 join and extend downwardly from the top surface of the strip portion, and join bottom wall 112 to form pocket 108. Bottom wall 112 is generally planar and parallel to the plane of strip portion 102, although the bottom wall may include a raised structure 111, adapted to support the bottom surface of a electronic component. Each wall may also be formed with a slight draft (i.e. a 2° to 12° slant toward the center of the pocket), to help prevent stacked layers of empty carrier tape from nesting together, which may make separation of adjacent layers difficult. It is also within the range of equivalents of the present invention to provide a pocket having more or less walls than the four that are shown with reference to the preferred embodiment (e.g. a circular pocket having only one wall, or a triangular pocket having three walls).

In the preferred embodiment, the pockets are designed to conform to the width and depth of the electronic components, to position the component more precisely within the pocket. The length of the pocket is preferably longer than the components, as will be described below, because the pocket is designed to carry components of different lengths. Although the illustrated carrier tapes include only one column of aligned pockets along the length of the carrier tape, two or more columns of pockets could also be formed to facilitate the delivery of multiple components. Furthermore, it is believed that a carrier tape including pockets having a longitudinal axis that extends transverse to the longitudinal axis of the tape (as shown in FIGS. 2 and 4) may be more effectively rolled about a core to form a roll for storage and shipment, without bending of or damage to the pockets or the components.

Figure 7:
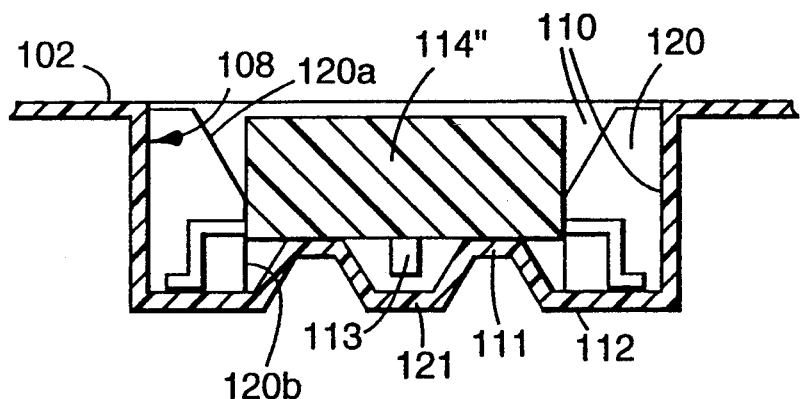
FIG. 7 is a sectional view at 7—7 of FIG. 6.
Figure 9:
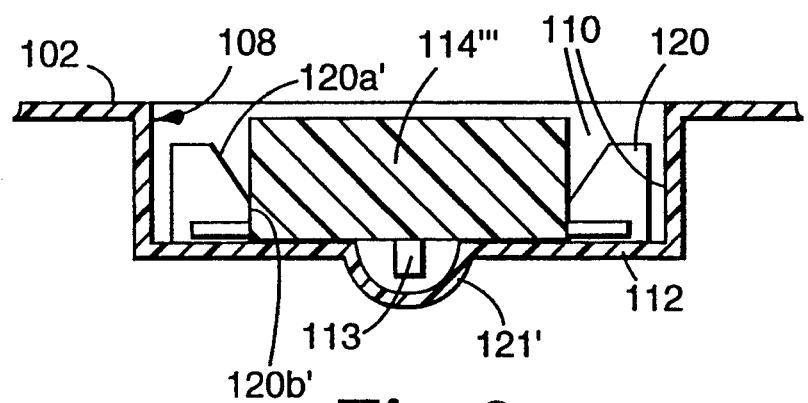
FIG. 9 is a sectional view at 9—9 of FIG. 8.
Figure 10:
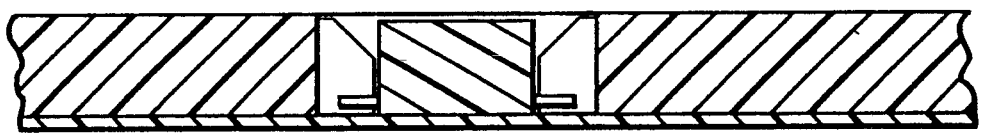
FIGS. 10 and 11 illustrate further embodiments of the carrier tape of the present invention.
Figure 11:
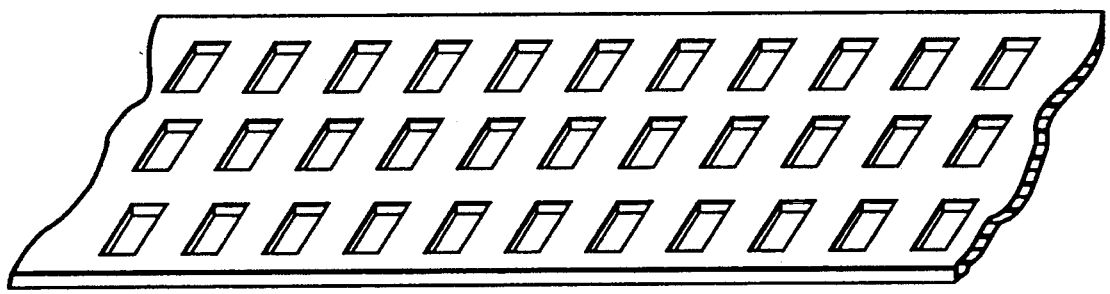

The electronic components are maintained in position within pockets 108 by lead-retaining slots 119 which are defined by ribs 120. Ribs 120 are shown in the illustrated embodiments as projecting both from walls 110 and from bottom wall 112, but could also comprise projections or bars extending solely from bottom wall 112, or solely from side walls 110. Furthermore, lead-retaining slots 119 and ribs 120 may be formed in any known shape that will maintain the component leads therein, and thus the present invention is not limited to the illustrated configuration. Preferably, however, the ribs 120 are shaped as truncated triangular portions, as shown in FIG. 1. Each such rib includes an inclined portion 120a that is inclined toward the center of the pocket, and a vertical portion 120b that adjoins the bottom wall of the pocket. The inclined portion 120a guides the component into the pocket, and the vertical portion 120b positively positions the component within the pocket, as shown in FIGS. 7 and 9.

Figure 2:
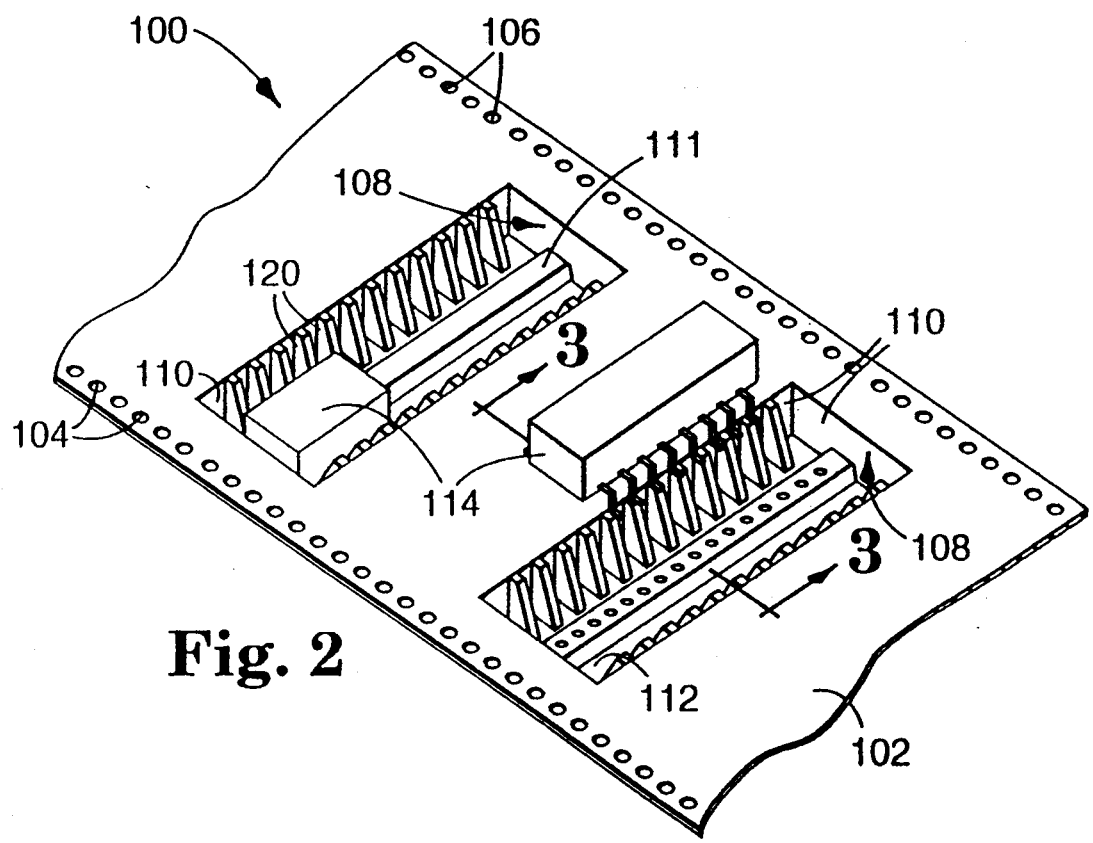
FIG. 2 is a perspective view of one embodiment of the carrier tape of the present invention.
Figure 4:
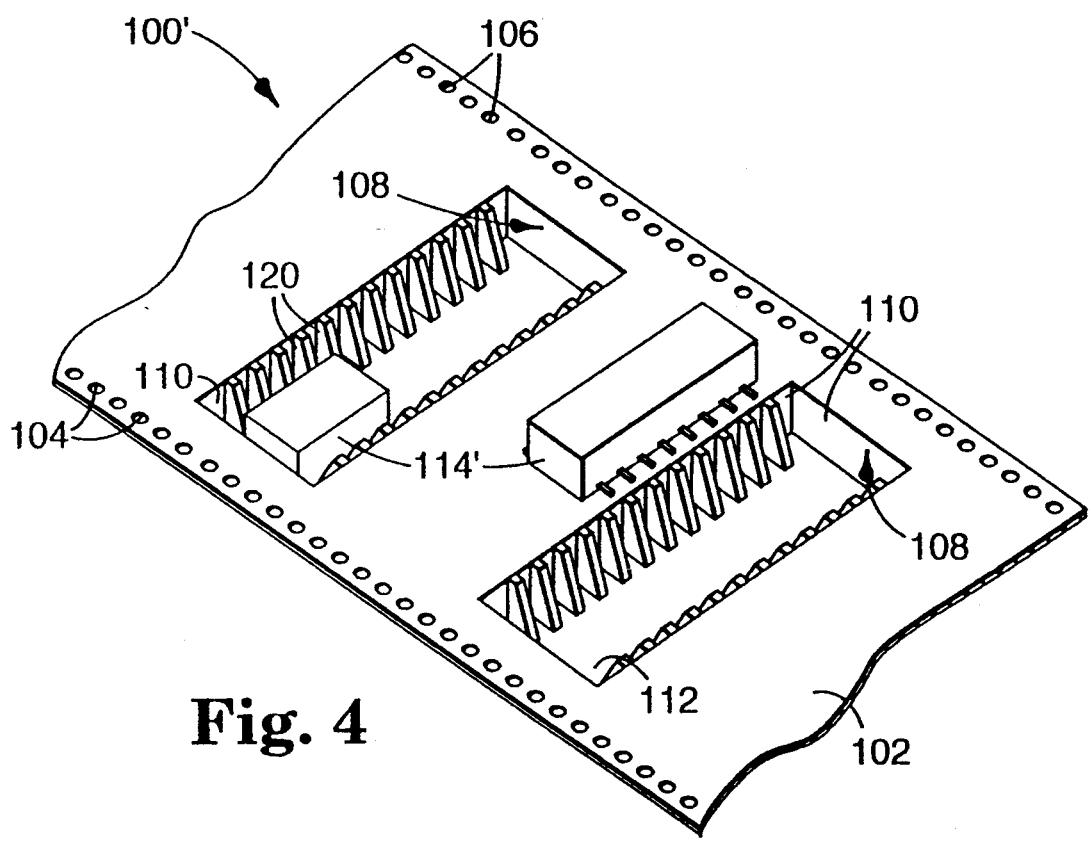
FIG. 4 is a perspective view of a second embodiment of the carrier tape of the present invention.
Figure 6:
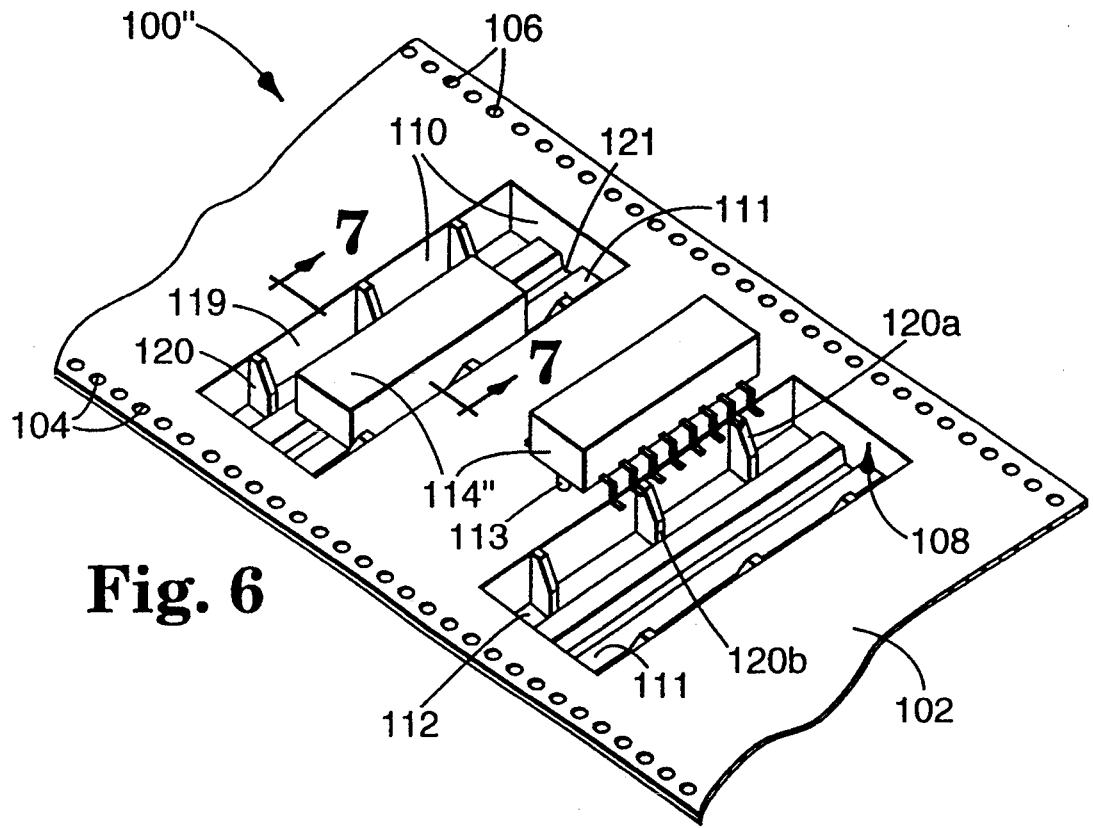
FIG. 6 is a perspective view of a third embodiment of the carrier tape of the present invention.
Figure 8:
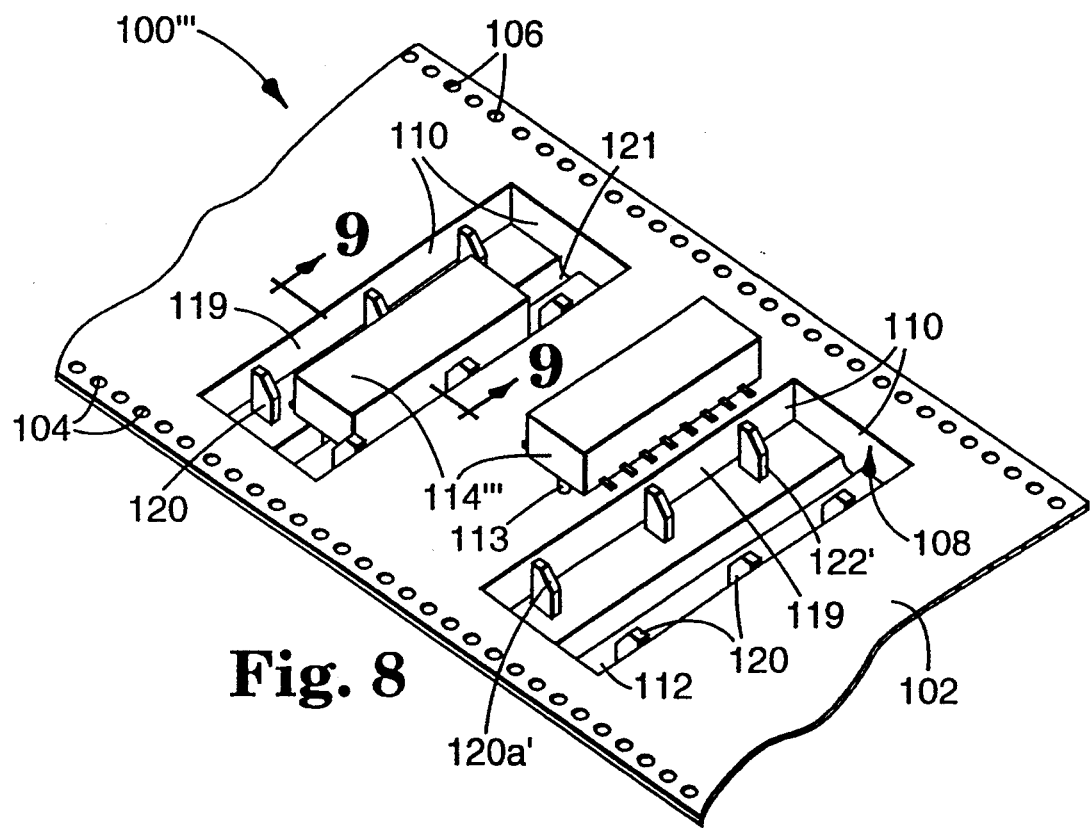
FIG. 8 is a perspective view of a fourth embodiment of the carrier tape of the present invention.

In one embodiment of the invention, the number of ribs 120 which define lead-retaining slots 119 in each pocket is greater than the number of leads of at least one of the electronic components that are to be conveyed by the carrier tape as shown in FIGS. 2 and 4. In another embodiment, the number of ribs 120 which define lead-retaining slots 119 is less than the number of leads of the electronic component retained in the pocket, as shown in FIGS. 6 and 8. In this configuration, the pocket preferably comprises central ribs near the middle of the pocket and a minimal number of ribs that define lead-retaining slots on either side of the central ribs such that the carrier tape is capable of retaining electronic components of different sizes or having different numbers of leads. As shown in FIGS. 2, 4, 6 and 8, the ribs 120 which define lead-retaining slots 119 are preferably arranged in two parallel aligned rows, for retaining the leads extending from two opposed sides of electronic components 114 and 114' carried therein.

By providing a number of lead-retaining slots that is greater than the number of leads of at least one of the components to be carried, or by providing a minimal number of ribs that are properly spaced so that components having a varying number of leads may be retained, an advantageous feature of the present invention results. Many components having an array of leads which are sized and spaced similar to those of larger components may be carried within the pocket. This allows a single size of carrier tape to be stocked and used by electronic component packagers for a variety of sizes of electronic components, thereby reducing the need for stocking a different size carrier tape for each size of component.

A second advantageous feature is that multiple components may be conveyed within a single pocket, so long as each component has leads that are sized and spaced to match the size and pattern of the lead-retaining slots. For example, two or more electronic components may be conveyed in adjacent relationship. By packaging two or more components within a single pocket, less carrier tape is required to convey the same number of components. In other embodiments, each component may be centered within the pocket, or each may be offset toward one side of carrier tape 100', as shown in FIG. 4.

Figure 3:
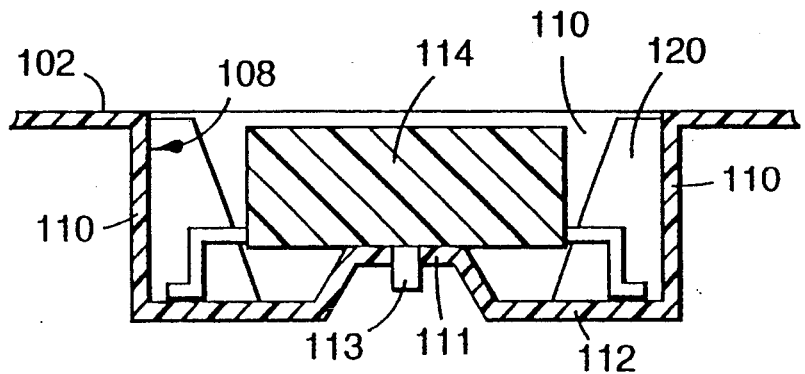
FIG. 3 is a sectional view at 3—3 of FIG. 2.

The carrier tape of the present invention could also include apertures formed in the bottom wall of each pocket, which apertures are adapted to receive mechanical posts 113 that project from the bottom face of the component, as illustrated in FIG. 3. The apertures should preferably be regularly spaced across the length of the pocket, to facilitate the positioning of longer and shorter components having posts at different locations. Alternately, the bottom wall could include a trough 121 which may extend below the plane of the bottom wall to receive mechanical posts 113, as illustrated in FIGS. 6 through 9. Furthermore, pocket 108 could include a raised portion 111 adjoining bottom wall 112 to raise the leads above bottom wall 112, as shown in FIGS. 3 and 6.

In another embodiment, bottom wall 112 may comprise a lower cover strip (not shown) that is applied to form a flat-punch carrier tape. A flat-punch carrier tape includes a strip portion having a thickness substantially equal to the depth of the pockets, and having holes punched therein corresponding to the length and width of the desired pocket. A lower cover strip is applied to the bottom of the carrier tape to provide bottom walls for each of the pockets. Thus the lower carrier tape adjoins the side walls to form the pocket, and may be applied to pockets having lead-retaining slots according to the present invention. A cover strip may also be applied to the top of the carrier tape, as described earlier, to contain the component within the pocket.

Figure 5:
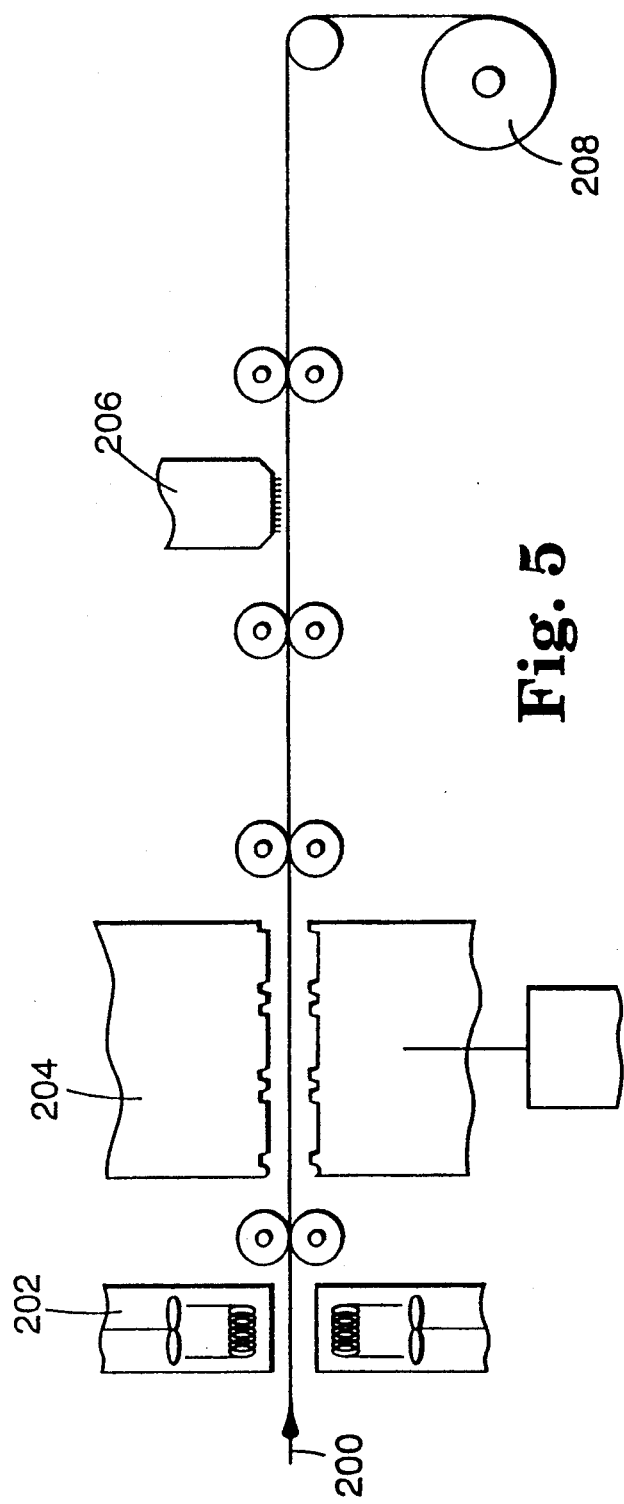
FIG. 5 is a schematic representation of a method for producing the carrier tape of the present invention.

In general, the carrier tape of the present invention is made by thermoforming pockets and lead-retaining slots in a sheet of polymeric material, forming advancement holes in the carrier tape by punching, and winding the carrier tape onto a core to form a roll, as shown schematically in FIG. 5. A polymeric sheet 200 is provided and may be made from many different materials including, but not limited to polyester, polycarbonate, polypropylene, styrene, PVC (polyvinylchloride), ABS (acrylonitrile-butadiene-styrene copolymers) copolymers, and the like. In the preferred embodiment, polymeric sheet 200 is electrically dissipative, and includes an electrically conductive material, such as carbon black, which is either interspersed within the material comprising the polymeric sheet, or is coated on the carrier tape after the tape is formed. The electrically conductive material allows an electric charge to dissipate throughout the carrier tape and preferably to the ground. This feature may prevent damage to the components contained within the carrier tape due to a static electric charge.

Polymeric sheet 200 is supplied, either in roll form, sheet form, by continuous injection molding, or by extrusion, and conveyed to heating means 202, where polymeric sheet 200 is heated sufficiently to permit thermoforming. The temperature to which the polymeric sheet must be heated varies over a broad range (i.e. 200°–370° F.) depending on the gauge and type of material that is being thermoformed.

Following heating, the sheet member is thermoformed by a die or dies 204 that shape the pocket to conform to the maximum size of the electronic component to be carried therein. The die may be opposed male and female dies that stamp the sheet material to mold the pockets. The carrier tape pockets could also be formed by vacuum forming the heated sheet material over a male die or into a female die, or by other molding means known in the art. The carrier tape is typically cooled after thermoforming, which can be accomplished by air cooling until the polymeric material solidifies.

As further shown at 206 in FIG. 5, advancement holes are punched into the pockets, and any excess material, known as weed, is cut from the edges of the carrier tape to conform the carrier tape to industry standards. The finished carrier tape is concentrically wound onto a core 208 to form a supply roll for storage until the carrier tape is loaded with components. Alternatively, the pockets of the carrier tape may be loaded with electronic components immediately after the tape is formed, and the loaded tape rolled for immediate use during a circuit assembly operation. In the preferred embodiment, a cover strip is placed over the top surface of the carrier tape and releasably bonded thereto to prevent contaminants from reaching the components. The cover strip must therefore be peeled away from the carrier tape in the manner earlier described before the components may be removed.

The process described above may be practiced in a variety of ways, for example by using a modified version of a machine such as an ETM 320 or an ETF 278B embossing and taping mechanism available from AR-COTRONICS MECCANICA of Italy, or from Mechanization of Active and Passive Components (M.A.P.C.) of Occidental, Calif. Modifications of the described process are also possible, and may incorporate manufacturing techniques that are known in the art.

The present invention has now been described with reference to several embodiments thereof. It will be apparent to those skilled in the art that many changes can be made in the embodiments described without departing from the scope of the invention. For example, certain other articles having similarly configured leads could be carried by the tape of the present invention. Thus, the scope of the present invention should not be limited by the structures described herein, but only by structures described by the language of the claims, and the equivalents of those structures.

I claim:

1. A flexible carrier tape for storage and delivery of components by an advancement mechanism, the carrier tape comprising:
   (a) a strip portion having a top surface, said strip portion including means for engaging the advancement mechanism;
   (b) a plurality of aligned pockets spaced along the carrier tape and opening through said top surface, said pockets each comprising
      (i) at least one side wall adjoining and extending downwardly from said top surface of said strip portion,
      (ii) a bottom wall portion adjoining said at least one side wall to form the pocket, and
      (iii) lead retaining means comprising a plurality of individual ribs that define a number of lead-retaining slots therebetween, the number of lead-retaining slots not equal to the number of leads of at least one of the components; and
   (c) at least one component within at least one pocket, said component having a body and a number of spaced leads arranged at least one aligned row and projecting from the body into the slots, at least one component having a different number of leads than the pocket in which it is contained has lead-retaining slots.

2. The carrier tape of claim 1, wherein said at least one side wall comprises four side walls, each side wall disposed at approximately a 90° angle with respect to each adjacent side wall.

3. The carrier tape of claim 1, wherein said ribs project only from said bottom wall.

4. The carrier tape of claim 1, wherein each of said ribs projects from both said bottom wall and said side wall.

5. The carrier tape of claim 1, and further including a cover strip releasably bonded to said top surface to cover said pockets.

6. The carrier tape of claim 1, wherein said bottom walls include a raised portion for holding said leads above said bottom walls of said pockets.

7. The carrier tape of claim 1, wherein said bottom walls each include one of a trough and a plurality of apertures formed therein and adapted to receive mechanical posts projecting from a component body.

8. The carrier tape of claim 1, wherein said strip portion has a thickness substantially equal to the depth of said pockets, and said bottom walls comprise a lower cover strip bonded to said strip portion.

9. The carrier tape of claim 1, wherein said carrier tape is electrically dissipative.

10. The carrier tape of claim 1, wherein said plurality of pockets includes more than one aligned column of pockets extending along the length of said carrier tape.

11. The carrier tape of claim 1, and further including an electronic component within each pocket.

12. The carrier tape of claim 11, wherein said carrier tape is concentrically wrapped around a core for storage and delivery of said carrier tape.

13. A flexible carrier tape for storage and delivery of components by an advancement mechanism, each component having a body including a number of leads arranged in at least one aligned row and projecting from the body, the carrier tape comprising:
   (a) a strip portion having a top surface, said strip portion including means for engaging the advancement mechanism;
   (b) a plurality of aligned pockets spaced along the carrier tape and opening through said top surface, said pockets each comprising
      (i) at least one side wall adjoining and extending downwardly from said top surface of said strip portion,
      (ii) a bottom wall adjoining said at least one side wall to form the pocket, and
      (iii) a plurality of individual ribs that define a number of lead-retaining slots therebetween, said ribs having portions inclined with respect to the bottom wall of the pocket to guide the components into the pocket, and vertical portions for positively positioning the component within the pocket, whereby the carrier tape is adapted to carry at least one component within each of said pockets.

14. The carrier tape of claim 13, wherein said at least one side wall comprises four side walls, each side wall disposed at approximately a 90° angle with respect to each adjacent side wall.

15. The carrier tape of claim 13, wherein said ribs project only from said bottom wall.

16. The carrier tape of claim 13, wherein each of said ribs projects from both said bottom wall and said side wall.

17. The carrier tape of claim 13, and further including a cover strip releasably bonded to said top surface to cover said pockets.

18. The carrier tape of claim 13, wherein said bottom walls include a raised portion for holding said leads above said bottom walls of said pockets.

19. The carrier tape of claim 13, wherein said bottom walls each include one of a trough and a plurality of apertures formed therein and adapted to receive mechanical posts projecting from a component body.

20. The carrier tape of claim 13, wherein said strip portion has a thickness substantially equal to the depth of said pockets, and said bottom walls comprise a lower cover strip bonded to said strip portion.

21. The carrier tape of claim 13, wherein said carrier tape is electrically dissipative.

22. The carrier tape of claim 13, wherein said plurality of pockets includes more than one aligned column of pockets extending along the length of said carrier tape.

23. The carrier tape of claim 13, and further including an electronic component within each pocket.

24. The carrier tape of claim 23, wherein said carrier tape is concentrically wrapped around a core for storage and delivery of said carrier tape.

* * * * *